(12) United States Patent
Lin

(10) Patent No.: US 11,658,153 B2
(45) Date of Patent: May 23, 2023

(54) FORMING RECESSES IN MOLDING COMPOUND OF WAFER TO REDUCE STRESS

(71) Applicant: Taiwan Semiconductor Manufacturing Company, Ltd., Hsinchu (TW)

(72) Inventor: Chun-Hung Lin, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 330 days.

(21) Appl. No.: 16/884,773

(22) Filed: May 27, 2020

(65) Prior Publication Data

US 2020/0286863 A1 Sep. 10, 2020

Related U.S. Application Data

(63) Continuation of application No. 15/289,681, filed on Oct. 10, 2016, now Pat. No. 10,685,936, which is a
(Continued)

(51) Int. Cl.
*H01L 21/31* (2006.01)
*H01L 25/065* (2023.01)
(Continued)

(52) U.S. Cl.
CPC ........ *H01L 25/0657* (2013.01); *H01L 21/565* (2013.01); *H01L 21/78* (2013.01); *H01L 21/784* (2013.01); *H01L 23/315* (2013.01); *H01L 23/3114* (2013.01); *H01L 23/3192* (2013.01); *H01L 24/11* (2013.01); *H01L 24/14* (2013.01); *H01L 24/19* (2013.01); *H01L 24/94* (2013.01); *H01L 23/562* (2013.01); *H01L 24/05* (2013.01); *H01L 24/13* (2013.01); *H01L 24/16* (2013.01); *H01L 24/32* (2013.01); *H01L 24/73* (2013.01); *H01L 24/92* (2013.01); *H01L 24/96* (2013.01); *H01L 2224/0401* (2013.01); *H01L 2224/04105* (2013.01); *H01L 2224/05008* (2013.01); *H01L 2224/05022* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05569* (2013.01);
(Continued)

(58) Field of Classification Search
CPC . H01L 23/315; H01L 25/0657; H01L 21/565; H01L 21/78; H01L 21/784; H01L 23/3114; H01L 23/3192; H01L 24/11; H01L 24/14; H01L 24/19
See application file for complete search history.

(56) References Cited

U.S. PATENT DOCUMENTS 3,729,573 A 4/1973 Dunn
5,309,026 A 5/1994 Matsumoto
(Continued)

*Primary Examiner* — Suberr L Chi
(74) *Attorney, Agent, or Firm* — Slater Matsil, LLP

(57) ABSTRACT

A chip includes a semiconductor substrate, an electrical connector over the semiconductor substrate, and a molding compound molding a lower part of the electrical connector therein. A top surface of the molding compound is lower than a top end of the electrical connector. A recess extends from the top surface of the molding compound into the molding compound.

20 Claims, 10 Drawing Sheets

Related U.S. Application Data continuation of application No. 14/175,080, filed on Feb. 7, 2014, now Pat. No. 9,472,481.

(51) Int. Cl.
  *H01L 21/56* (2006.01)
  *H01L 21/78* (2006.01)
  *H01L 23/00* (2006.01)
  *H01L 23/31* (2006.01)
  *H01L 21/784* (2006.01)

(52) U.S. Cl.
  CPC ............... *H01L 2224/05572* (2013.01); *H01L 2224/11009* (2013.01); *H01L 2224/11849* (2013.01); *H01L 2224/12105* (2013.01); *H01L 2224/131* (2013.01); *H01L 2224/13014* (2013.01); *H01L 2224/13016* (2013.01); *H01L 2224/13022* (2013.01); *H01L 2224/13023* (2013.01); *H01L 2224/14131* (2013.01); *H01L 2224/14133* (2013.01); *H01L 2224/14134* (2013.01); *H01L 2224/14179* (2013.01); *H01L 2224/16147* (2013.01); *H01L 2224/16225* (2013.01); *H01L 2224/16237* (2013.01); *H01L 2224/32225* (2013.01); *H01L 2224/73204* (2013.01); *H01L 2224/92125* (2013.01); *H01L 2224/94* (2013.01); *H01L 2225/06513* (2013.01); *H01L 2924/1032* (2013.01); *H01L 2924/10253* (2013.01); *H01L 2924/10271* (2013.01); *H01L 2924/10272* (2013.01); *H01L 2924/12042* (2013.01); *H01L 2924/181* (2013.01); *H01L 2924/18162* (2013.01)

(56) References Cited

U.S. PATENT DOCUMENTS

| | | |
|---|---|---|
| 6,173,490 B1 | 1/2001 | Lee et al. |
| 2011/0227190 A1 | 9/2011 | Chang et al. |
| 2011/0233747 A1 | 9/2011 | Lee et al. |
| 2011/0272824 A1* | 11/2011 | Pagaila ............... H01L 29/0657 257/777 |
| 2012/0228780 A1 | 9/2012 | Kim et al. |
| 2013/0009307 A1 | 1/2013 | Lu et al. |
| 2013/0147034 A1 | 6/2013 | Chen |
| 2013/0341800 A1 | 12/2013 | Tu et al. |
| 2014/0217597 A1* | 8/2014 | Lin ................... H01L 23/49894 257/773 |

* cited by examiner

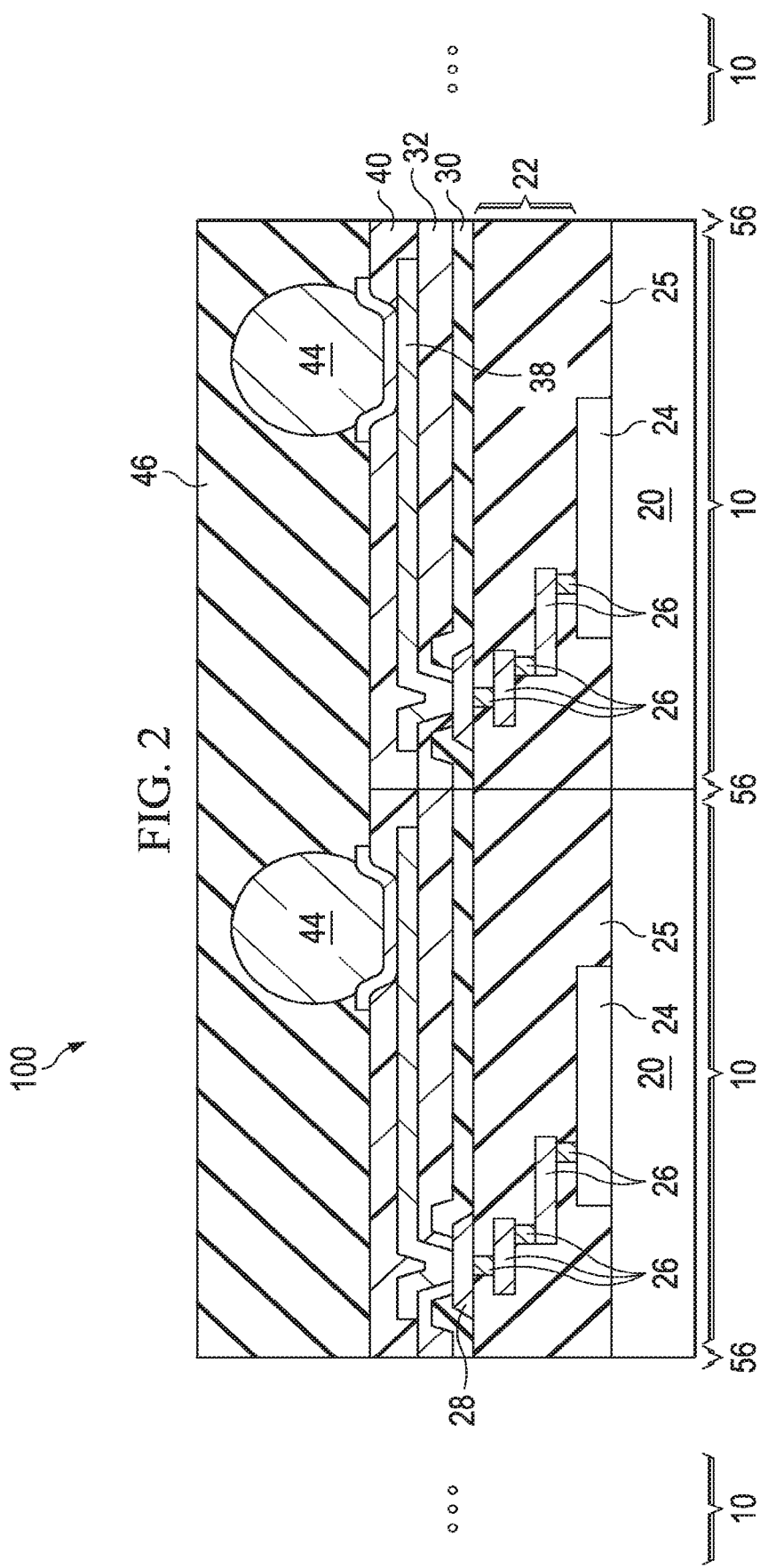

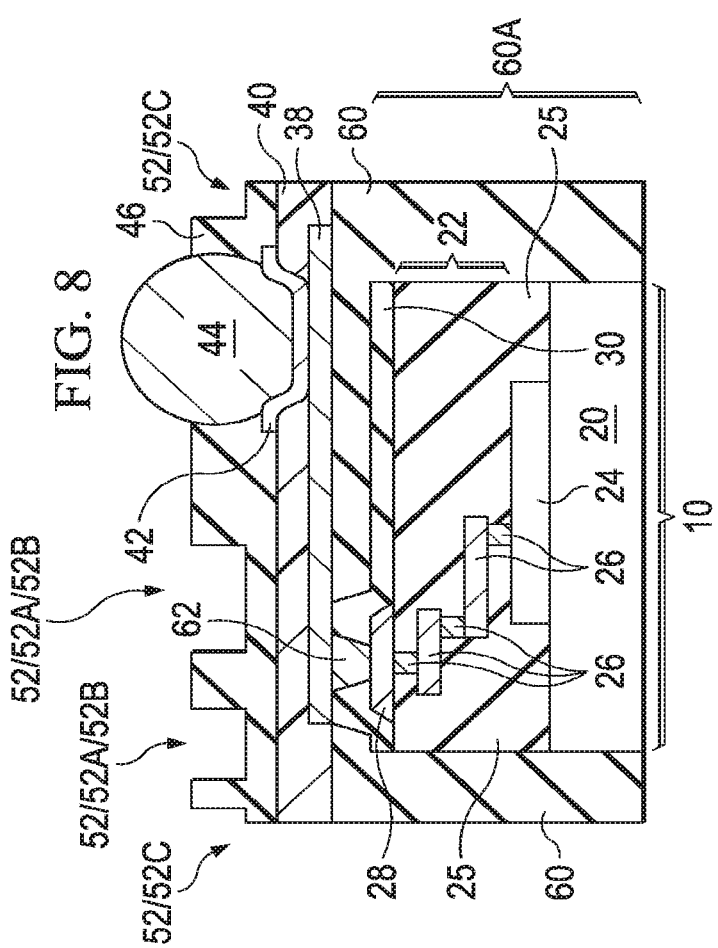

FORMING RECESSES IN MOLDING COMPOUND OF WAFER TO REDUCE STRESS

PRIORITY CLAIM AND CROSS-REFERENCE

This application is a continuation of U.S. patent application Ser. No. 15/289,681, entitled "Forming Recesses in Molding Compound of wafer to Reduce Stress," filed on Oct. 10, 2016, which is a continuation of U.S. patent application Ser. No. 14/175,080, entitled "Packages with Stress-Reducing Structures and Methods of Forming Same," filed on Feb. 7, 2014, now U.S. Pat. No. 9,472,481 issued on Oct. 18, 2016, which applications are incorporated herein by reference.

BACKGROUND

In the formation of a Wafer-Level Chip Scale Packages (WLCSP), integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polyimide layer are formed on the metal pad, with the metal pad exposed through the openings in the passivation layer and the first polyimide layer.

A Post-passivation interconnect (PPI) is then formed, followed by the formation of a second polyimide layer over the PPI. An Under-Bump Metallurgy (UBM) is formed extending into an opening in the second polyimide layer, wherein the UBM is electrically connected to the PPI. A solder ball is then placed over the UBM and reflowed.

A molding compound is then applied to protect the solder ball. In the application of the molding compound, a liquid molding compound is applied, followed by pressing a release film on the liquid molding compound to squeeze out excess liquid molding compound. As a result, the top portion of the solder ball is exposed through the liquid molding compound. The liquid molding compound is then cured. After the curing of the liquid molding compound into a solid state, the release film is removed. The wafer is then sawed into a plurality of dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A, FIGS. 1B and 2 through 6 illustrate the cross-sectional views and top views of intermediate stages in the formation of a die in accordance with some embodiments;

FIG. 8 illustrates the cross-sectional view of a fan-out package in accordance with some embodiments.

DETAILED DESCRIPTION

Figure 1A:
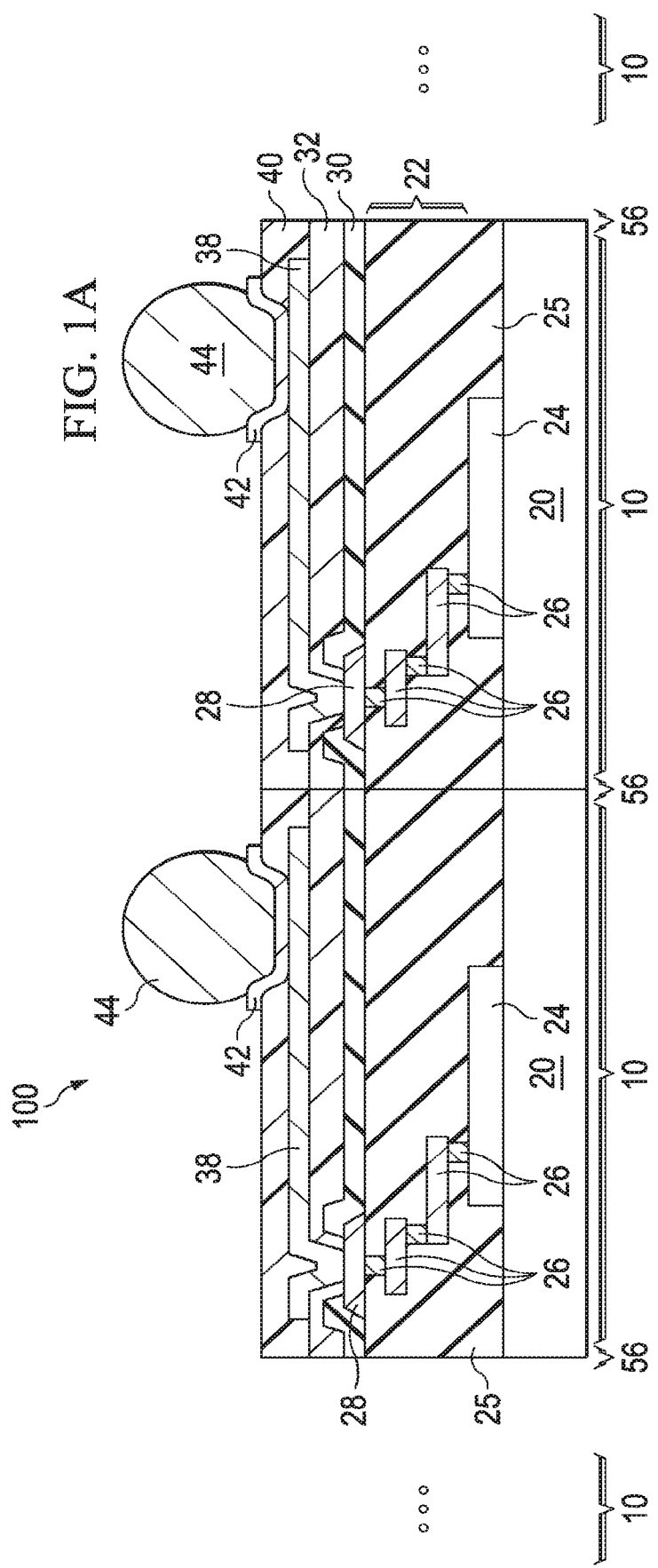

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including stress-reducing structures and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIG. 1A illustrates the cross-sectional view of wafer 100 in accordance with an embodiment. Wafer 100 includes a plurality of chips 10 therein, with scribe lines 56 separating chips 10 from each other. Wafer 100 (and each of chips 10) includes substrate 20, which may be a semiconductor substrate, such as a silicon substrate. Semiconductor substrate 20 may also be formed of other semiconductor materials such as silicon germanium, silicon carbon, a III-V compound semiconductor, or the like. Active devices 24 such as transistors are formed at the surface of substrate 20. Interconnect structure 22 is formed over substrate 20. Interconnect structure 22 includes metal lines and vias 26 formed therein and electrically coupled to the semiconductor devices 24. Metal lines and vias 26 are formed in low-k dielectric layers 25, which may be extreme (or extra) low-k (ELK) dielectric layers that have dielectric constants lower than 2.5, or lower than about 2.0.

Metal pads 28 are formed over interconnect structure 22. Metal pads 28 may comprise aluminum, copper, aluminum copper, silver, gold, nickel, tungsten, alloys thereof, and/or multi-layers thereof. It is appreciated that although one metal pad 28 is illustrated in each of chips 10, a plurality of metal pads 28 may exist in the same chip 10. Metal pads 28 may be electrically coupled to semiconductor devices 24, for example, through the underlying interconnect structure 22. Passivation layer 30 and polymer layer 32 cover the edge portions of metal pads 28. In some exemplary embodiments, passivation layer 30 is formed of dielectric materials such as silicon oxide, silicon nitride, or multi-layers thereof. Openings are formed in passivation layer 30 and polymer layer 32 to expose metal pads 28.

Polymer layer 32 is over passivation layer 30, wherein polymer layer 32 extends into the openings in passivation layer 30. Polymer layer 32 may include a photo-sensitive material in accordance with some embodiments. For example, the material of polymer layer 32 includes, and is not limited to, polyimide, polybenzoxazole (PBO), and the like. Polymer layer 32 is also patterned to form additional openings, so that metal pads 28 are exposed.

Post-passivation interconnects (PPIs) 38 are formed, wherein each of PPIs 38 includes a first portion over polymer layer 32, and a second portion extending into the opening in passivation layer 30 and polymer layer 32. The second portions of PPIs 38 are electrically coupled to, and may contact, the corresponding metal pads 28.

Polymer layer 40 is further formed over PPIs 38. Polymer layer 40 may be formed of a material selected from the same candidate materials of polymer layer 32. Under-bump metallurgies (UBMs) 42 are formed to extend into the openings in polymer layer 40. UBMs 42 are electrically coupled to PPIs 38, and may contact PPI pads in PPIs 38, wherein the PPI pads are integral portions of PPIs 38 that are wider than other portions. Electrical connectors 44 are formed over UBM 42. Each of chips 10 may include a plurality of electrical connectors 44, although one is illustrated. In some embodiments, electrical connectors 44 are solder balls formed and/or placed over UBMs 42 and reflowed. In alternative embodiments, electrical connectors 44 include non-solder metal pillars, wherein solder layers may also be formed on the top surfaces of the non-solder metal pillars.

Figure 1B:
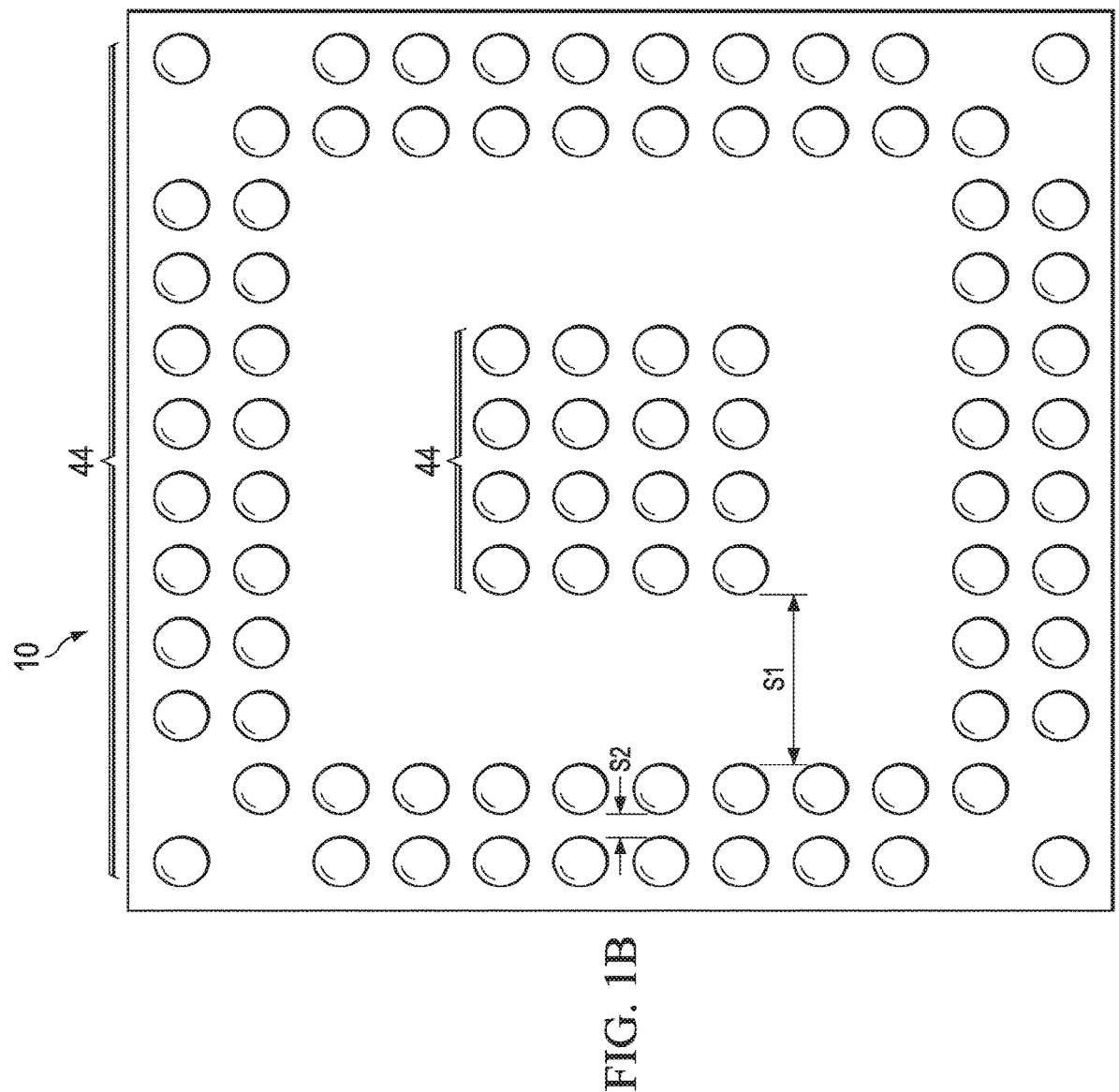

FIG. 1B illustrates an exemplary top view of one of chips 10. A plurality of electrical connectors 44 is distributed throughout the surface of chip 10. In some embodiments, electrical connectors 44 are not uniformly distributed, with the spacings between electrical connectors 44 being non-uniform. For example, the spacings between neighboring electrical connectors 44 include spacings S1 and S2, wherein spacing S1 is greater than spacing S2. In alternative embodiments, electrical connectors 44 are uniformly distributed to form an array.

Next, as shown in FIG. 2, liquid molding compound 46 is dispensed on wafer 100, wherein electrical connectors 44 are submerged under liquid molding compound 46. Liquid molding compound 46 is such named due to its low viscosity. Alternatively, the top portions of electrical connectors 44 are over the top surface of liquid molding compound 46.

Figure 3:
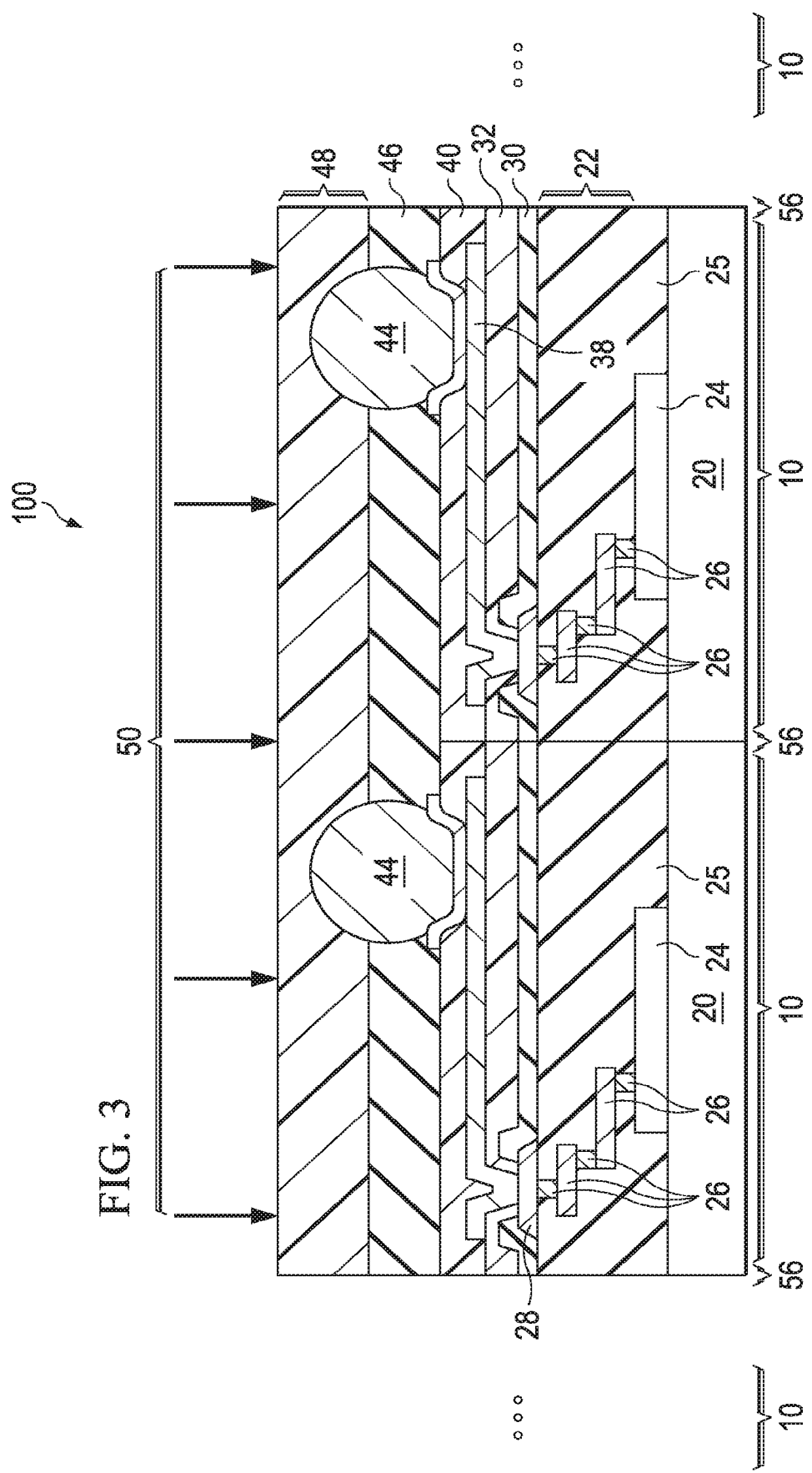

Referring to FIG. 3, release film 48 is applied on liquid molding compound 46. Although FIGS. 2 and 3 illustrate that release film 48 is applied after dispensing liquid molding compound 46, in alternative embodiments, release film 48 is applied first (with release film 48 and wafer 100 being in a mold), and liquid molding compound is injected into the space defined by release film 48.

A pressure is applied, as shown by arrows 50. Release film 48 is formed of a soft material, so that the top portions of electrical connectors 44 is pressed into release film 48. Furthermore, release film 48 pushes excess portions of liquid molding compound 46 away from the top surface of wafer 100, and the bottom surface of release film 48 is lower than the top end of electrical connectors 44.

With release film 48 remaining being pushed against electrical connectors 44 and liquid molding compound 46, a curing step is performed to cure and solidify liquid molding compound 46. After the solidification of molding compound 46, the top ends of electrical connectors 44 are lower than the top surface of molding compound 46.

Figure 4:
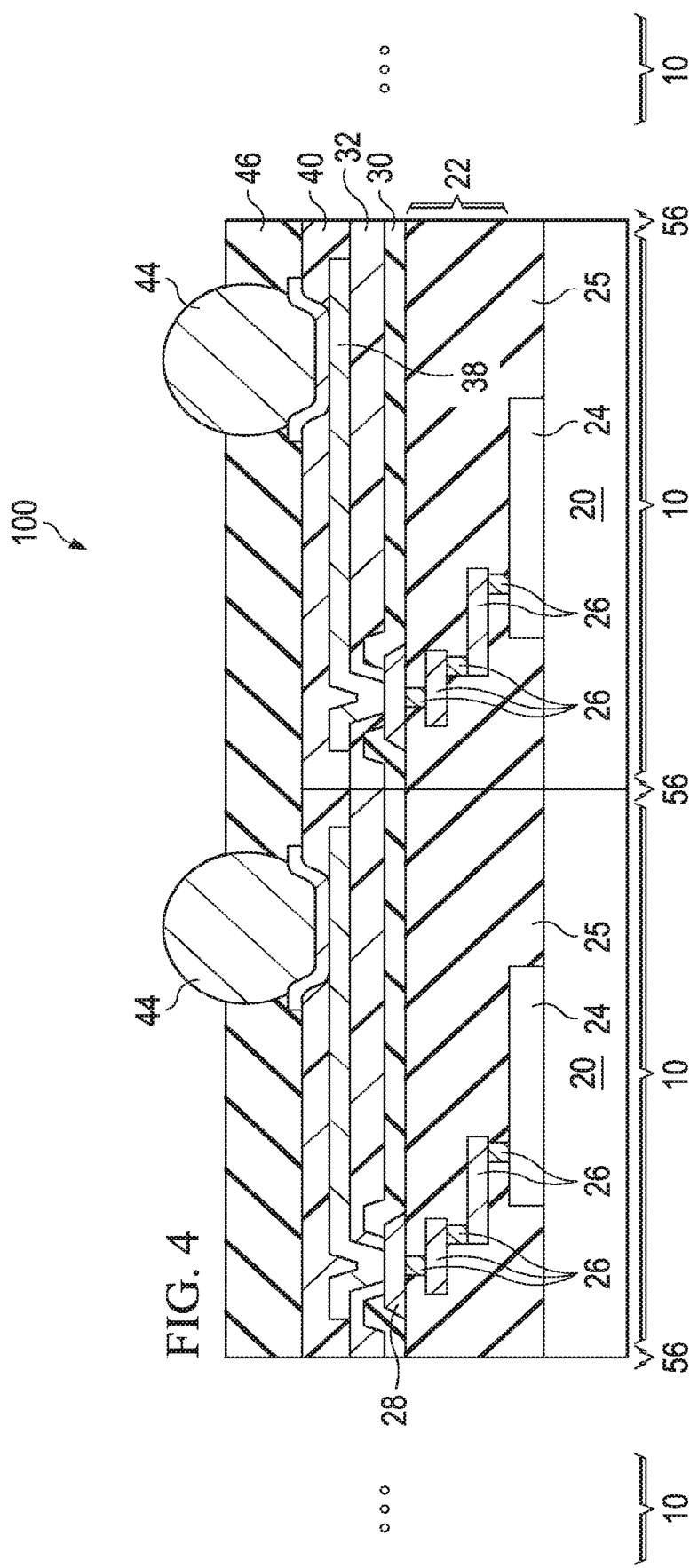

Release film 48 is then peeled off from molding compound 46, which is now in a solid form. The resulting structure is shown in FIG. 4. The molding compound residue remaining on the top surface of electrical connectors 44 is etched. In the resulting structure, molding compound 46 is formed with a portion of electrical connectors 44 buried therein. The top ends of electrical connectors 44 are higher than the top surface of molding compound 46.

Figure 5A:
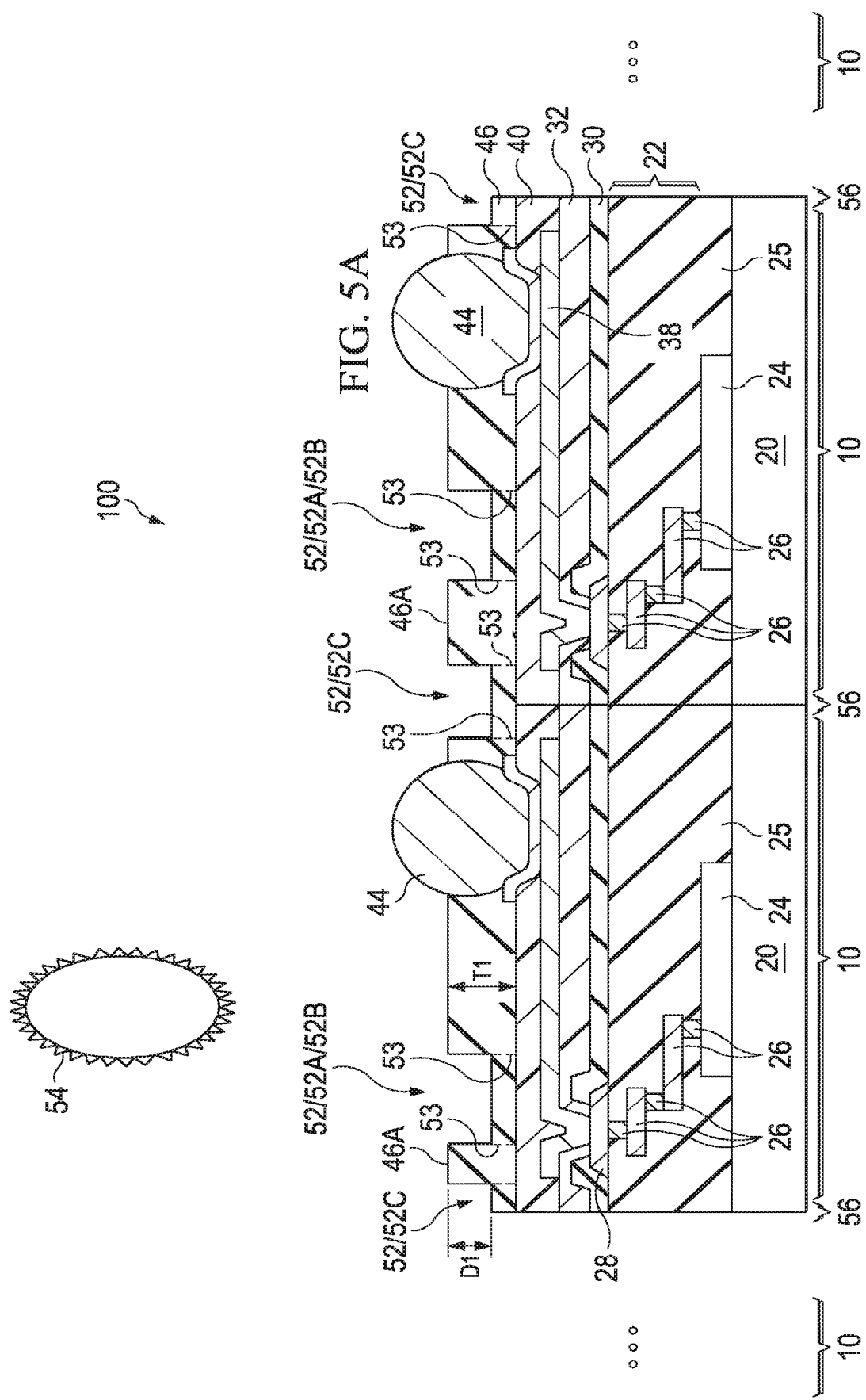

FIG. 5A illustrates a cross-sectional view in the formation of recesses 52 in molding compound 46. In accordance with some embodiments, recesses 52 extend from the top surface 46A into an intermediate level of molding compound 46. In alternative embodiments, recesses 52 penetrate through molding compound to reach the underlying polymer layer 40. Dashed lines 53 illustrate the bottom parts of the sidewalls of the corresponding recesses 52. Depth D1 of recesses 52 may be greater than about 50 percent of thickness T1 of molding compound 46. Depth D1 may also be between about 50 percent and about 80 percent of thickness T1. Molding compound 46 has an internal stress. For example, molding compound 46 shrinks when solidified, and hence suffers from an internal stress. The stressed molding compound 46 accordingly applies a tensile stress to the underlying low-k dielectric layer 25. Recesses 52 has the function of reducing/releasing the internal stress of molding compound 46, and hence the stress applied to the underlying low-k dielectric layers 25 by molding compound 46 is also reduced. The stress-releasing effect is related to the ratio D1/T1, and the higher the ratio is, the more efficient the stress-releasing function of recesses 52. Hence, ratio D1/T1 is preferably higher than about 0.5. With depth D1 being smaller than about, for example, 80 percent, of thickness T1, the stress-releasing function of recesses 52 may have a layer left (with enough margin), so that PPIs 38 (when polymer layer 40 is not applied) and polymer layer 40 may be protected by molding compound 46.

As shown in FIG. 5A, recesses 52 include internal recesses 52A and 52B (also refer to FIG. 6), which are inside chips 10 and are spaced apart from the edges of the respective chips 10. Recesses 52 further include edge recesses 52C, which are at the boundaries of chips 10. Edge recesses 52C may overlap scribe lines 56 of wafer 100.

In some embodiments, as shown in FIG. 5A, recesses 52 are formed through laser cut, wherein a laser is used to burn parts of molding compound 46. In alternative embodiments, recesses 52 are formed using blade/drill bit 54 to cut or drill molding compound 46. Accordingly, the sidewalls shapes of recesses 52 are defined by the blade or the drill bit. For example, recesses 52 may have V-shaped bottom connected to vertical sidewalls in some embodiments, or may have a substantially flat bottom similar to what is shown in FIG. 5A. The sidewalls of recesses 52 may also be vertical, or may be slanted when tapered blade/drill bit 54 is used.

Figure 5B:
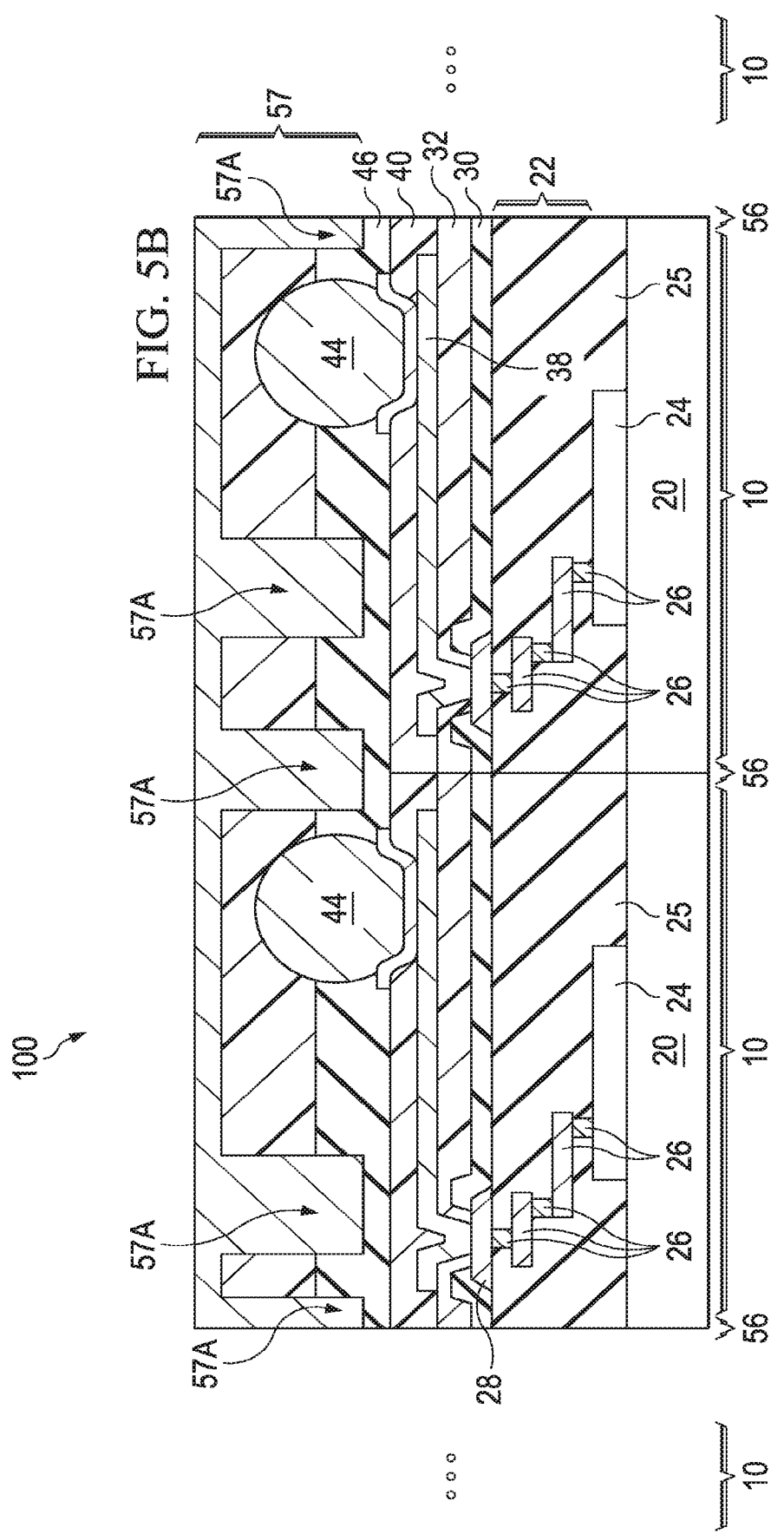

In alternative embodiments, as shown in FIG. 5B, recesses 52 are formed through molding. In these embodiments, during the process in which release film 48 (FIG. 3) is pressed on molding compound 46, molding compound 46 is partially cured. Accordingly, when release film 48 (FIG. 3) is removed, molding compound 46 is not fully hardened and remains to be soft, although it is no longer flowable. Next, as shown in FIG. 5B, mold 57 is pressed against molding compound 46. The pins 57A of mold 57 are inserted into molding compound 46. The positions and the sizes of pins 57A are designed to be identical to the desirable positions and the shapes of recesses 52. With mold 57 being pressed against molding compound 46, the curing is continued to further cure molding compound 46. In some embodiments, mold 57 is removed after molding compound 46 is fully cured. After mold 57 is removed, the resulting recesses in wafer 100 have the shape as shown in FIG. 5A.

In these embodiments, depending on the shapes of pins 57A, recesses 52 (FIG. 5A) may either have vertical sidewalls that perpendicular to the top surface of molding compound 46, or may have slant sidewalls, with the lower parts of recesses 52 being narrower than the corresponding top parts of recesses 52. Recesses 52 may also have substantially flat bottom surfaces or slanted bottom surfaces.

Figure 6:
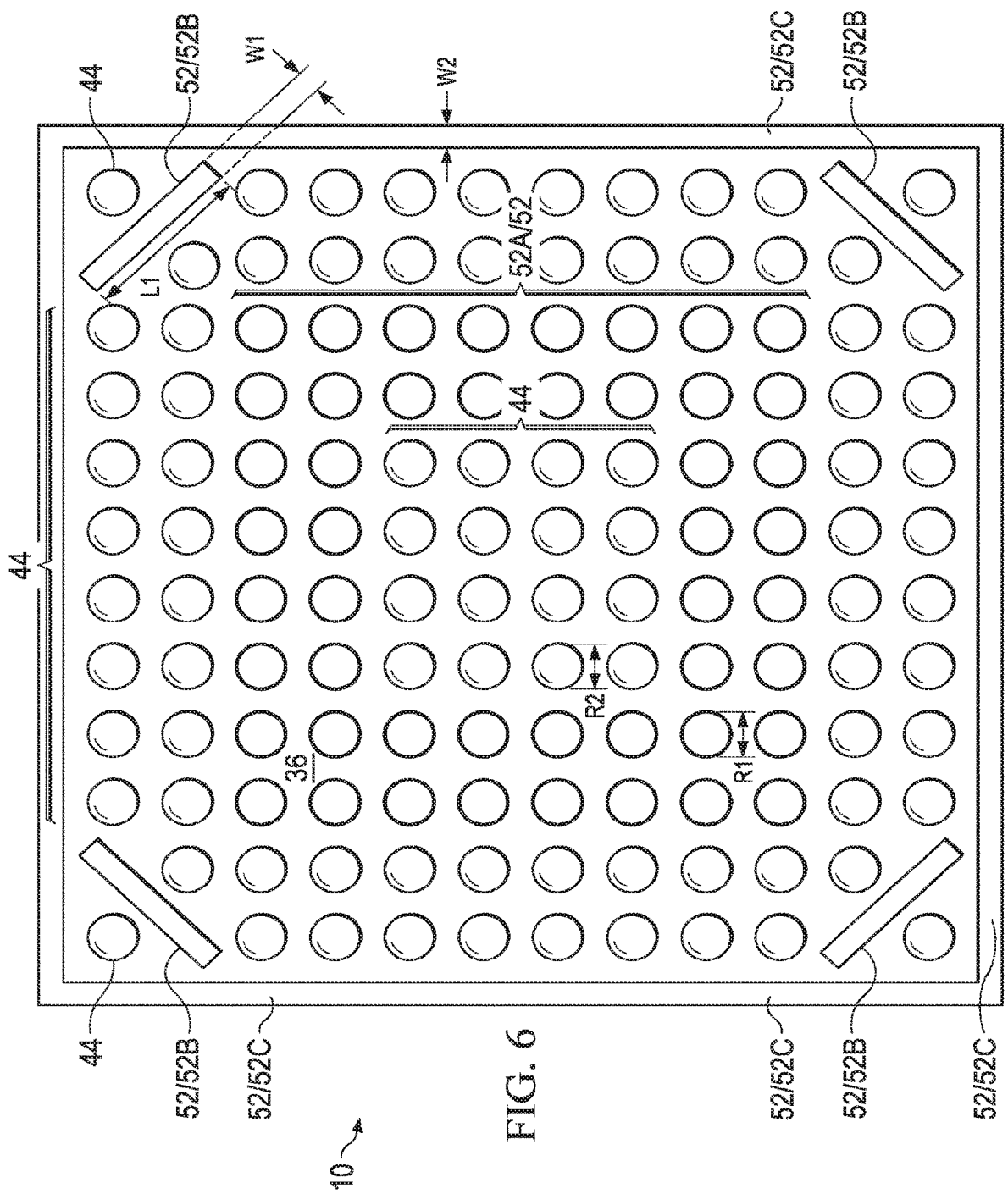

After forming recesses 52, wafer 100 is diced in a die-saw process, and hence chips 10 are separated from each other. FIG. 6 illustrates an exemplary top view of chip 10. In the top view of the exemplary chip 10, recesses 52 include recesses 52A, 52B, and 52C in any combination. It is appreciated that chip 10 may include one type, two types, or all three types of recesses 52A, 52B, and 52C in any combination. Recesses 52A may have circular top-view shapes, and may be formed using drill bits, laser, or the like. Radius R1 of recesses 52A may be between about 50 percent and about 150 percent the lateral dimension R2 of electrical connectors 44. In some embodiments, recesses 52A and electrical connectors 44 in combination form an array. Alternatively stated, recesses 52A are formed where the array can have electrical connectors 44A, but no electrical connectors 44A are disposed. As shown in FIG. 6, an array of inner electrical connectors 44 may be encircled by some recesses 52A. Some of recesses 52A may be aligned to an inner ring (a first ring) encircling the array of inner electrical connectors 44, and some of recesses 52A may be aligned to an outer ring (a second ring) encircling the inner ring. The inner ring and the outer ring, to which the recesses 52A are aligned, may also be rectangular rings, as shown in FIG. 6.

Recesses 52B have an elongated shape in the top view of chip 10. For example, recesses 52B may have a rectangular top view. Recesses 52B may be formed using a blade, laser, or the like. Recesses 52B are also formed wherein no electrical connectors 44 are disposed. The lengths of recesses 52B are determined by the available space. In some embodiments, recesses 52B have length L1 greater than about 200 percent lateral dimension R2 of electrical connectors 44. Width W1 of recesses 52B may be between about 50 percent and about 150 percent the lateral dimension R2 of electrical connectors 44.

Recesses 52C are the edge recesses at the edges, and extend to the edges, of chip 10 as illustrated in FIG. 6. Since recesses 52C has a ring-shape in the top view as shown in FIG. 6, it is also referred to as a recess ring. Width W2 of recesses 52B may be between about 50 percent and about 150 percent the lateral dimension R2 of electrical connectors 44, although greater or smaller values may also be used. In some embodiments, as shown in FIG. 6, recesses 52C are formed on all edges of chips 10. In alternative embodiments, recesses 52C are formed on some (for example, one, two, or three), but not all, of the edges of chips 10. These embodiments may be used when electrical connectors 44 are close to some of the edges of chips 10, and there is no enough space for forming edge recesses 52C at these edges. As shown in the cross-sectional view of chip 10 in FIG. 7, which includes a cross-sectional view of chip 10, edge recesses 52C result in some steps to be formed at the edges of chips 10, wherein each of the steps include two top surfaces of molding compound 46 connected by a sidewall of the corresponding recess 52C.

Referring again to FIG. 6, due to the shrinkage of molding compound 46, stresses occur in molding compound 46. The significant components of the stresses are in the directions parallel to the top surface of molding compound 46. The inner recesses 52A and 52B cut the stress paths, and hence the stresses are reduced. The stresses are high at the corners and the edges of chips 10, and the high stresses may cause the chipping of molding compound 46. By forming edge recesses 52C, the portions of molding compound 46 that have the high stresses are removed, and hence the chipping of the edge portions of molding compound 46 is reduced.

Figure 7:
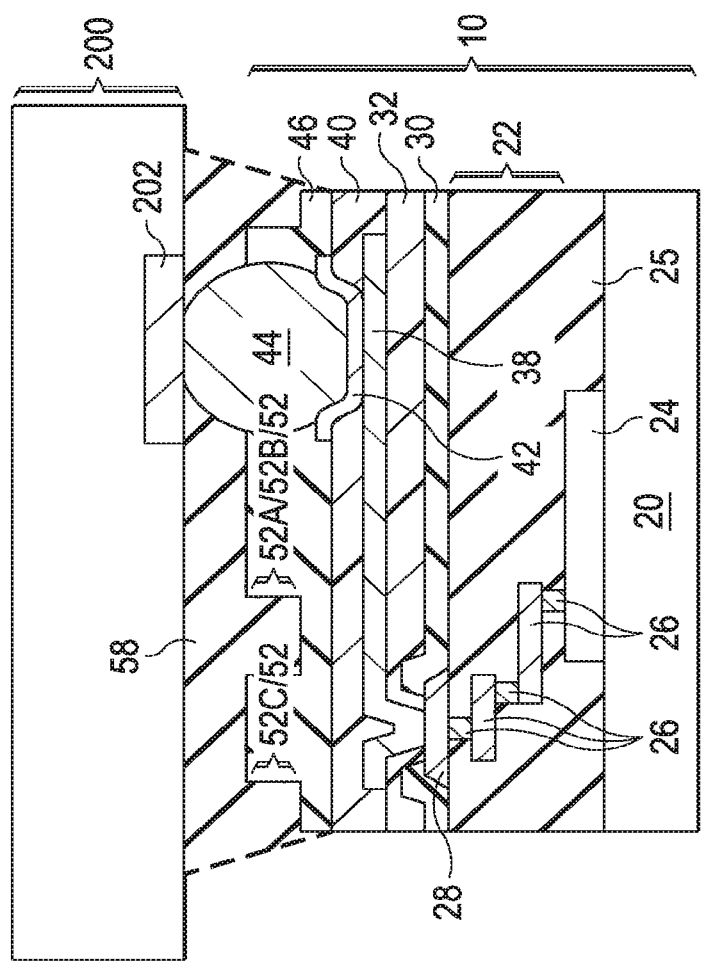
FIG. 7 illustrates the cross-sectional view in the bonding of a die to a package component in accordance with some embodiments.

FIG. 7 illustrates the bonding of chip 10 to another package component 200, which may be a package substrate, an interposer, or a printed circuit board, for example. Electrical connector 44 is bonded to electrical connector 202 of package component 200, wherein electrical connector 202 may be a metal pad, a metal pillar, or the like. In some embodiments, the gap between chip 10 and package component 200 is filled with underfill 58. Hence recesses 52 are filled with underfill 58 also. In alternative embodiments, no underfill is disposed into the gap between chip 10 and package component 200. Hence, recesses 52 remain to be air gaps.

FIG. 8 illustrates a fan-out package in accordance with alternative embodiments, wherein PPI 38 extends into the region beyond the edges of chip 10. In these embodiments, molding compound 60 is used to mold chip 10 therein. Molding compound 60 may include a ring portion 60A that encircles chip 10, wherein the ring portion 60A is in contact with the sidewalls of substrate 20, passivation layer 30, and polymer layer 32. The top surface of molding compound 60 may be level with the top surface of metal pillar 62. PPI 38 and polymer layer 40 are formed overlying molding compound 60. Recesses 52 (which include 52A. 52B, and/or 52C) are formed in molding compound 46, similar to what is shown in FIGS. 5A, 5B, and 6. In these embodiments, some of recesses 52 may overlap chip 10, while some other recesses 52 may overlap the ring portion 60A of molding compound 60. The fan-out package in FIG. 8 may also be bonded with package component 200 as in FIG. 7, and recesses 52 may also be filled with an underfill.

The embodiments of the present disclosure have some advantageous features. By forming recesses in the molding compound that molds electrical connectors (such as solder balls), the stress paths are cut short, and hence the stress in the molding compound is reduced. As a result, the stress applied to the underlying low-k dielectric layer by the molding compound is also reduced. Simulation results indicate that by forming circular holes to form an array with solder balls, the stress applied to the low-k dielectric layer may be reduced by about 43 percent (Note, this is calculate as 1−(0.88/1.55) since the stress should be compared to the scenario where LMC is applied).

In accordance with some embodiments of the present disclosure, a chip includes a semiconductor substrate, an electrical connector over the semiconductor substrate, and a molding compound molding a lower part of the electrical connector therein. A top surface of the molding compound is lower than a top end of the electrical connector. A recess extends from the top surface of the molding compound into the molding compound.

In accordance with alternative embodiments of the present disclosure, an integrated circuit structure includes a substrate, a metal pad over the substrate, a passivation layer having a portion over the metal pad, a polymer layer over the passivation layer, and a PPI. The PPI includes a first portion over the polymer layer, and a second portion extending into the polymer layer. The PPI is electrically coupled to the metal pad. A solder region is over and electrically coupled the PPI. A molding compound is over the PPI. The molding compound surrounds, and is in physical contact with, a lower portion of the solder region. An upper portion of the solder region protrudes out of the molding compound. A recess extends from a top surface of the molding compound into the molding compound, wherein a bottom of the recess is higher than a bottom surface of the molding compound.

In accordance with yet alternative embodiments of the present disclosure, a method includes dispensing a molding compound over an electrical connector, wherein the electrical connector is over a substrate of a wafer. The method further includes applying a release film over the molding compound, and pressing the release film against the electrical connector, wherein a top portion of the electrical connector is pressed into the release film. The molding compound is cured when the release film is pressed against the molding compound. The release film is removed from the molding compound. A recess is formed in the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a chip comprising:
      a semiconductor substrate;
      a first plurality of electrical connectors over the semiconductor substrate;
      a molding compound molding lower parts of the first plurality of electrical connectors therein, wherein a top surface of the molding compound is lower than top ends of the first plurality of electrical connectors; and
      a plurality of recesses extending into the molding compound, wherein the plurality of recesses are aligned to a first ring encircling the first plurality of electrical connectors.

2. The integrated circuit structure of claim 1 further comprising a second plurality of electrical connectors aligned to a second ring encircling the first ring.

3. The integrated circuit structure of claim 1, wherein the plurality of recesses extend to, and stop at, an intermediate level of the molding compound, and wherein the intermediate level is between the top surface and a bottom surface of the molding compound.

4. The integrated circuit structure of claim 1, wherein the plurality of recesses penetrate through the molding compound.

5. The integrated circuit structure of claim 1, wherein the plurality of recesses have circular top-view shapes.

6. The integrated circuit structure of claim 1 further comprising an elongated recess extending into the molding compound.

7. The integrated circuit structure of claim 1, wherein the plurality of recesses and the first plurality of electrical connectors are in combination arranged as an array.

8. The integrated circuit structure of claim 1 further comprising a recess ring extending from four edges of the chip inwardly toward a center of the chip.

9. An integrated circuit structure comprising:
   a semiconductor substrate;
   a metal pad over the semiconductor substrate;
   a first plurality of solder regions over the metal pad, wherein one of the first plurality of solder regions is electrically connected to the metal pad, and wherein the first plurality of solder regions are aligned to a rectangular ring;
   a molding compound surrounding, and in physical contact with, lower portions of the first plurality of solder regions, wherein upper portions of the first plurality of solder regions protrude out of the molding compound; and
   a plurality of recesses extending from a top surface of the molding compound into the molding compound, wherein the plurality of recesses are encircled by the rectangular ring.

10. The integrated circuit structure of claim 9, wherein bottoms of the plurality of recesses are higher than a bottom surface of the molding compound.

11. The integrated circuit structure of claim 10, wherein a depth of the plurality of recesses is greater than about 50 percent of a thickness of the molding compound.

12. The integrated circuit structure of claim 9 further comprising a recess ring extending into the molding compound, wherein the recess ring comprises four portions joined with each other, and each of the four portions extends to an edge of a respective chip.

13. The integrated circuit structure of claim 9 further comprising an underfill extending into the plurality of recesses.

14. The integrated circuit structure of claim 13 further comprising:
   a package component over and bonding to the first plurality of solder regions, wherein the underfill is in a gap between the molding compound and the package component.

15. The integrated circuit structure of claim 9 further comprising a second plurality of solder regions encircled by the rectangular ring.

16. The integrated circuit structure of claim 9, wherein the first plurality of solder regions and the plurality of recesses in combination form an array.

17. An integrated circuit structure comprising:
   a substrate comprising a first edge;
   a metal pad over the substrate;
   a polymer layer over the metal pad;
   a solder region over and electrically coupling to the metal pad;
   an encapsulant surrounding, and is in physical contact with, a lower portion of the solder region, wherein an upper portion of the solder region protrudes out of the encapsulant; and
   a first recess extending from a top surface of the encapsulant into the encapsulant, wherein the first recess has a top-view shape of a ring, and wherein the first recess extends to a second edge of the encapsulant, with the second edge flush with the first edge.

18. The integrated circuit structure of claim 17, wherein the first recess extends to four edges of a respective chip that comprises the substrate and the encapsulant.

19. The integrated circuit structure of claim 17 further comprising a plurality of second recesses encircled by the first recess, wherein the plurality of second recesses surround the solder region.

20. The integrated circuit structure of claim 17 further comprising an underfill, wherein the underfill extends into the first recess.

* * * * *